(12) United States Patent
Selvamanickam

(10) Patent No.: US 8,227,019 B2
(45) Date of Patent: Jul. 24, 2012

(54) HIGH-THROUGHPUT EX-SITU METHOD FOR RARE-EARTH-BARIUM-COPPER-OXIDE (REBCO) FILM GROWTH

(75) Inventor: Venkat Selvamanickam, Wynantskill, NY (US)

(73) Assignee: SuperPower Inc., Schenectady, NY (US)

( * ) Notice: Subject to any disclaimer, the term of this patent is extended or adjusted under 35 U.S.C. 154(b) by 935 days.

(21) Appl. No.: 10/736,223

(22) Filed: Dec. 15, 2003

(65) Prior Publication Data

US 2005/0127133 A1    Jun. 16, 2005

(51) Int. Cl.
B05D 5/12    (2006.01)
H01L 39/24    (2006.01)

(52) U.S. Cl. ......... 427/62; 427/377; 427/383.1; 29/599; 505/430; 505/434; 505/470; 505/482; 505/500; 505/730; 505/740; 505/742

(58) Field of Classification Search ............... 427/62, 427/383.1, 377; 29/599; 505/430, 434, 470, 505/482, 740, 742, 500, 730
See application file for complete search history.

(56) References Cited

U.S. PATENT DOCUMENTS

| | | | |
|---|---|---|---|
| 4,962,085 A * | 10/1990 | deBarbadillo et al. | 505/500 |
| 5,006,508 A | 4/1991 | Treacy et al. | |
| 5,021,399 A | 6/1991 | Hsu et al. | |
| 5,081,102 A | 1/1992 | Gay et al. | |
| 5,114,911 A | 5/1992 | Shei et al. | |
| 5,142,074 A | 8/1992 | Treacy et al. | |
| 5,206,216 A * | 4/1993 | Yoshida | 505/434 |
| 5,231,074 A * | 7/1993 | Cima et al. | 505/434 |
| 5,278,138 A * | 1/1994 | Ott et al. | 505/446 |
| 5,376,594 A | 12/1994 | Covino-Hrbacek | |
| 5,416,063 A | 5/1995 | Gross et al. | |
| 5,480,862 A | 1/1996 | Miszenti | |
| 5,484,766 A | 1/1996 | Shah et al. | |
| 5,653,806 A * | 8/1997 | Van Buskirk | 118/715 |
| 5,972,847 A | 10/1999 | Feenstra et al. | |
| 6,083,885 A * | 7/2000 | Weinstein | 505/320 |
| 6,610,428 B2 * | 8/2003 | Smith et al. | 428/701 |
| 6,774,088 B2 * | 8/2004 | Manabe et al. | 505/100 |
| 6,794,339 B2 * | 9/2004 | Wiesmann et al. | 505/470 |
| 6,797,313 B2 * | 9/2004 | Fritzemeier et al. | 427/62 |
| 2003/0050195 A1 | 3/2003 | Wiesmann et al. | |
| 2003/0127051 A1 | 7/2003 | Fritzemeier et al. | |
| 2003/0130129 A1 | 7/2003 | Seleznev et al. | |
| 2004/0163597 A1 * | 8/2004 | Lee et al. | 118/724 |
| 2005/0014032 A1 * | 1/2005 | Wiesmann et al. | 428/701 |
| 2005/0014653 A1 * | 1/2005 | Reeves et al. | 505/100 |
| 2005/0065035 A1 * | 3/2005 | Rupich et al. | 505/300 |
| 2005/0123286 A1 * | 6/2005 | Lok | 392/385 |

* cited by examiner

Primary Examiner — Brian K Talbot
(74) Attorney, Agent, or Firm — Abel Law Group, LLP

(57) ABSTRACT

The present invention provides a high-throughput system for the ex-situ formation of a superconducting thin film, such as rare-earth-barium-copper-oxide (REBCO), atop a continuous length of buffered metal substrate tape by heating a buffered metal substrate tape coated with precursors of REBCO These precursors, when heated and introduced to water vapor within a process chamber, decompose to form a functional superconducting thin film epitaxial to the buffer layer. A chamber such as a metalorganic chemical vapor deposition (MOCVD) reactor having showerhead and substrate heater assemblies designed for the creation of a long and wide deposition zone is well suited for use in the process the system. The chamber could be of cold-wall type where the walls are not heated or could of hot-wall type where the walls are heated.

18 Claims, 2 Drawing Sheets

HIGH-THROUGHPUT EX-SITU METHOD FOR RARE-EARTH-BARIUM-COPPER-OXIDE (REBCO) FILM GROWTH

FIELD OF THE INVENTION

The present invention relates to high-throughput ex-situ film growth of high-temperature superconducting (HTS) films such as rare-earth-barium-copper-oxide (REBCO).

BACKGROUND OF THE INVENTION

In the past three decades, electricity has risen from 25% to 40% of end-use energy consumption in the United States. With this rising demand for power comes an increasingly critical requirement for highly reliable, high quality power. As power demands continue to grow, older urban electric power systems in particular are being pushed to the limit of performance, requiring new solutions.

Wire forms the basic building block of the world's electric power system, including transformers, transmission and distribution systems, and motors. The discovery of revolutionary HTS compounds in 1986 led to the development of a radically new type of wire for the power industry; this discovery is the most fundamental advance in wire technology in more than a century.

HTS-coated wire offers best-in-class performance, carrying over one hundred times more current than conventional copper and aluminum conductors of the same physical dimension do. The superior power density of HTS-coated wire will enable a new generation of power industry technologies. It offers major size, weight, and efficiency benefits. HTS technologies will drive down costs and increase the capacity and reliability of electric power systems in a variety of ways. For example, HTS-coated wire is capable of transmitting two to five times more power through existing rights of way. This new cable will offer a powerful tool to improve the performance of power grids while reducing their environmental footprint. However, to date only short samples of the HTS-coated tape used in the manufacture of next-generation HTS-coated wires have been fabricated at high performance levels. In order for HTS technology to become commercially viable for use in the power generation and distribution industry, it will be necessary to develop techniques for continuous, high-throughput production of HTS-coated tape.

The structure of HTS-coated tape consists of a polished metal substrate that provides strength and flexibility supporting an HTS film formed of, for example, rare-earth-barium-copper-oxide (REBCO). One or more buffer layers are disposed between a polished metal substrate and the HTS film to prevent reaction between the substrate and the HTS film and to provide a template for the epitaxial growth of the film. The buffer layer may be formed of, for example, yttrium-stabilized zirconia (YSZ) and/or cerium oxide ($CeO_2$).

The techniques that exist for the manufacture of REBCO-coated tapes can be classified as in-situ or ex-situ processes. In-situ processes encompass those in which film growth occurs entirely in one place, as when a vapor containing rare-earth, barium, and copper precursors reacts with oxygen at the surface of a heated substrate to form the REBCO film. In-situ techniques include sputtering, electron beam (e-beam) evaporation, and pulsed laser deposition (PLD) processes, each of which occurs in a single low-pressure oxygen atmosphere such as a vacuum chamber.

On the other hand, ex-situ techniques encompass deposition processes that occur in more than one step, separated in time and often in space as well, as precursors are deposited atop a substrate and subsequently undergo a separate post reaction that converts the precursors to a REBCO film. The precursors may be initially deposited atop the buffered substrate via a number of processes known to the art, including electron beam evaporation, a coating step such as dip coating in metalorganic deposition (MOD), and spray pyrolysis.

In electron beam evaporation used in an ex-situ process, evaporation occurs to three separate crucibles containing rare-earth, barium fluoride, and copper metals. In the MOD process, triflouroacetic acid (TFA) complexes of rare-earth, barium, and copper are mixed with a solvent such as methyl alcohol, and the resulting solution is applied to the buffered substrate in a dipcoating process under ambient conditions, and the dipped substrate subsequently undergoes a bakeout process in which the organics are baked off the substrate. The dip coating and bakeout steps are then repeated a number of times until the desired film thickness is achieved.

In spray pyrolysis, nitrates of rare-earth, barium, and copper form an aqueous precursor solution that is atomized and sprayed atop the heated buffered substrate. In spray pyrolysis, the spray and bakeout steps occur simultaneously by heating the substrate at moderate temperature, for instance, 500° C. that is not high enough to form superconducting REBCO phase.

Gross, et al. U.S. Pat. No. 5,416,063, dated May 16, 1995 and entitled, "Method of Producing a Layer of Superconductive Oxide," provides a method for forming a superconducting layer on a buffered substrate in which a precursor solution is applied to the substrate such that a metal-containing layer is formed on the surface. The precursor solution described in the U.S. Pat. No. 5,416,063 patent is formed by dissolving rare-earth-, barium-, and copper-containing compounds in acetic acid and water. However, as is the case with all ex-situ HTS film growth techniques, a post process is required to convert the metal-containing layer atop the buffered substrate to a superconducting film.

The post process may be a water vapor reaction, in which the substrate is heated and water vapor is applied to and reacts with rare-earth, barium fluoride, and copper metals contained thereon to form the REBCO film. However, the post reaction occurs very slowly, with film growth on the order of only 1 Angstrom per second, when compared with in-situ REBCO film growth techniques, in which film formation occurs in a single step and at a rate of up to 1-5 microns per minute, such as with PLD. It remains a challenge to provide an ex-situ REBCO film growth system well suited for the high throughput necessary to enable cost-effective production, and hence widespread adaptation of HTS materials in the electricity transmission/distribution industry. As a result, the method described by the U.S. Pat. No. 5,416,063 patent is not well suited for the manufacture of long lengths of HTS tapes.

One of the limitations of the present technologies is that, as an attempt to grow thicker and thicker REBCO films is made, it becomes increasingly difficult to force the water vapors to penetrate the dense deposited layer consisting of precursors of rare-earth, barium, and copper.

It is crucial to the attainment of high-quality HTS tapes that the water vapor penetrates deeply into the deposited precursor layer for film growth to occur from the bottom of the deposited precursor layer up, such that the REBCO film is grown epitaxial to the buffer layers and acquires the desired texture. When the REBCO film growth occurs from the top of the deposited precursor layer down, the nucleation and subsequent growth of the polycrystalline grains that comprise the REBCO film occurs randomly, with a high degree of grain boundary misalignment that severely compromises the current-carrying capability of the HTS film, as opposed to a biaxial texture that assures a high current-carrying capability.

It is further a challenge to effectively exhaust the reaction byproducts of the REBCO film production process which limit the reaction kinetics and inhibit REBCO film growth.

It is therefore an object of the invention to provide a process for producing thick high quality REBCO films.

It is an object of the invention to provide a process that provides for removal of reaction byproducts that limit the reaction kinetics and inhibit REBCO film growth.

It is a further object of the invention to provide a high-throughput ex-situ REBCO film growth system.

BRIEF DESCRIPTION OF THE FIGURES

These and other features, aspects, and advantages of the present invention will become better understood when the following detailed description is read with reference to the accompanying drawings in which like characters represent like parts throughout the figures, wherein.

SUMMARY OF THE INVENTION

The present invention provides a high-throughput system for the ex-situ formation of a superconducting thin film, such as REBCO, atop a continuous length of buffered metal substrate tape. Atop the buffered metal substrate tape are precursors of rare-earth, barium, and copper deposited via any of a number of techniques, such as electron beam evaporation and MOD. These precursors, when heated and introduced to water vapor within a process chamber, decompose to form a functional superconducting thin film epitaxial to the buffer layers. A chamber such as a metalorganic chemical vapor deposition (MOCVD) reactor having showerhead and substrate heater assemblies designed for the creation of a long and wide deposition zone is well suited to the process. The chamber includes exhaust ports that are positioned for effective pumping away of the reaction by-products. The chamber could be of cold-wall type where the walls are not heated or could of hot-wall type where the walls are heated.

DESCRIPTION OF THE INVENTION

Figure 1:
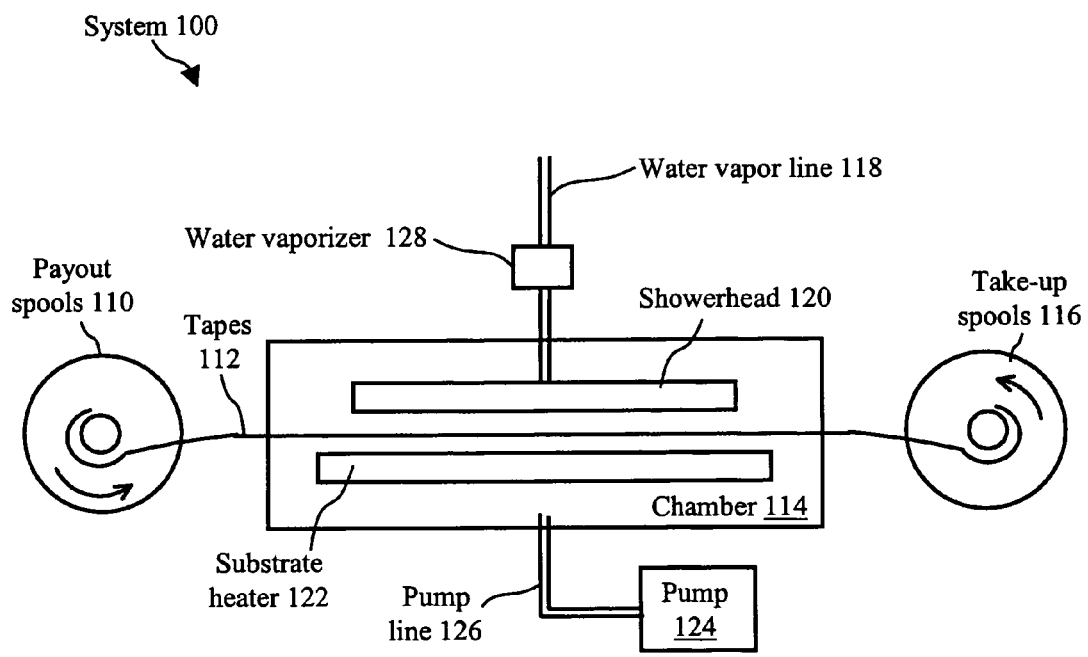
FIG. 1 illustrates a system in accordance with the present invention for the high-throughput ex-situ manufacture of REBCO-coated tapes.

FIG. 1 illustrates a system 100 in accordance with the invention for the high-throughput ex-situ manufacture of REBCO-coated tapes. The system 100 includes a motorized reel-to-reel spooling system that serves to translate a plurality of tapes 112 from a plurality of payout spools 110 through a chamber 114 and onto a plurality of take-up spools 116. The reel-to-reel spooling system is well known in the art and includes a drive motor (not shown) functionally connected to each payout spool 110 and each take-up spool 116, as well as a series of idlers (not shown) that come into contact with each of the tapes 112 to precisely position the tapes 112 with respect to the appropriate elements of the system 100. In another embodiment, tapes 112 could be a single, wide tape.

The tapes 112 are a plurality of flexible lengths of substrate formed from a variety of metals, such as stainless steel or a nickel alloy such as Inconel, upon which buffer layers such as YSZ and/or $CeO_2$ have been previously deposited via a deposition technique such as ion beam-assisted deposition (IBAD). Tapes 112 could also be biaxially-textured produced by process well known in the art as RABiTS. In that case, the buffer layers are epitaxially grown using processes such as but not limited to sputtering, evaporation, MOD, Metal Organic Chemical Vapor Deposition (MOCVD) and PLD. Further, atop the buffer layers, precursors of rare-earth, barium, and copper have been previously deposited via a technique such as electron beam evaporation, MOD, or spray pyrolysis, as is well known in the art.

The tapes 112 have dimensions that may vary to meet the desired finished product and system limitations. For example, the tapes 112 may have a thickness of 25 to 100 microns, a width of 1 to 50 cm, and a length of 100 meters to 1000 meters. The chamber 114 is a vacuum-sealed deposition chamber such as a cold-wall reactor maintained at a pressure of, for example, between about 0.1 and about 760 Torr, preferably between about 1 to about 760 Torr under a flow gas condition with a flow rate ranging between 1 slm and 100 slm.

Figure 2:
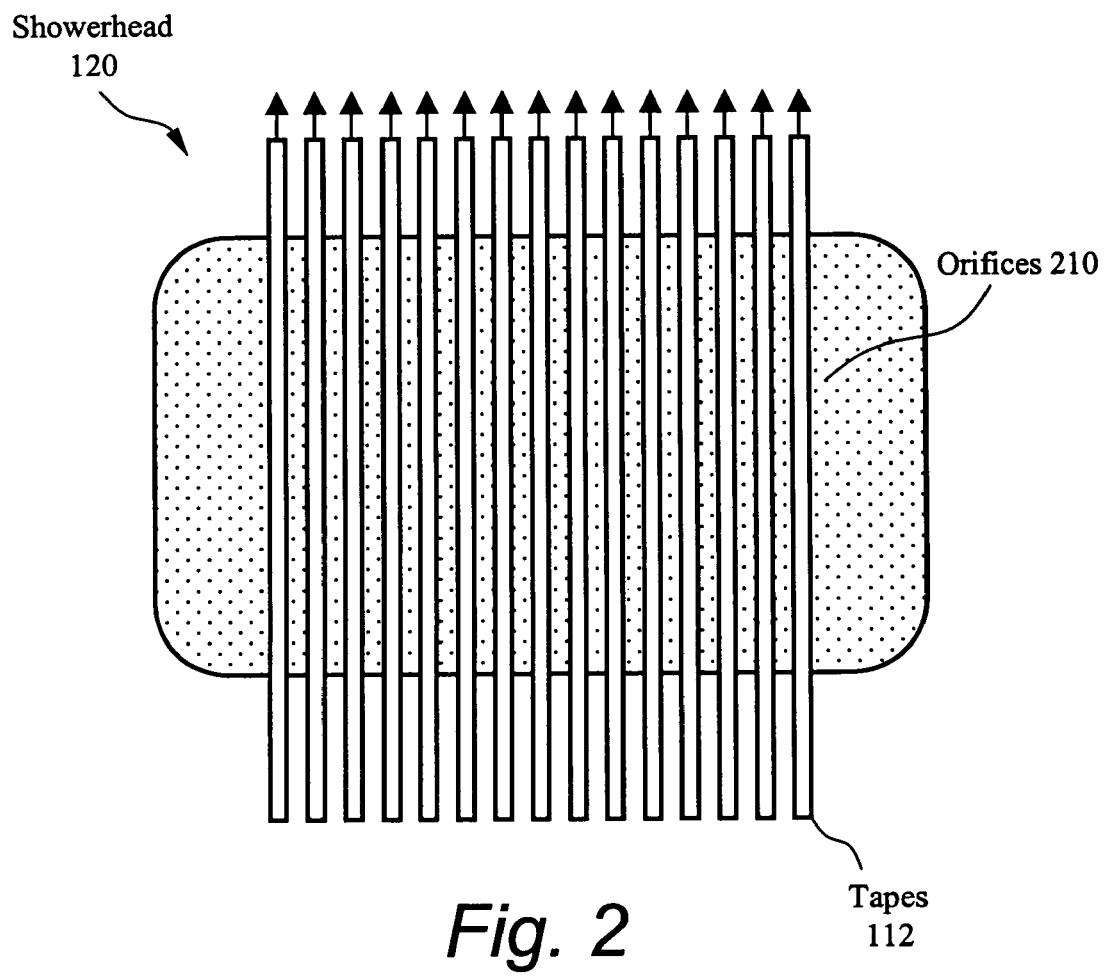
FIG. 2 illustrates a bottom view of the showerhead of the system of the present invention.

Housed within the chamber 114 is a showerhead 120 and a substrate heater 122 disposed with respect to one another to create a film-growth zone in the region of space directly therebetween. The showerhead 120, as shown in FIG. 2 in greater detail, enables a uniform distribution of inert carrier gas containing oxygen and water vapor over a given area, and may assume a stainless steel form composed of an upper and lower flange clamped together with a plurality of bolts and seal formed therein by a gasket. A plurality of orifices 210 are machined through the lower flange and arranged as a series of evenly spaced fine openings.

The film-growth zone defined by the dimensions of the showerhead 120 and the substrate heater 122 may measure up to about 10 meters in length and enables the conversion of a film consisting of precursors of rare-earth, barium, and copper to a REBCO film simultaneously upon, for example, ten to twenty translating tapes 112 evenly spaced approximately two millimeters apart. In an alternate embodiment, the conversion process could be implemented on precursors previously deposited on a singlewide tape up to 50 cm in width. In one embodiment, the showerhead may have a length at least as great as the width, the width being at least as wide as the sum of the widths of the translating tapes plus the sum of the distances between each of the translating tapes.

The substrate heater 122 is a well-known single or multiple zone substrate heater that provides heating, typically in the range of about 700 to about 850° C., to the tapes 112 via a radiant heating element, such as a lamp. Alternately, the substrate heater 114 is a resistance heater that utilizes a heating element such as Kanthal or $MoSi_2$. Alternately, in a hot-wall chamber, the substrate heater 114 could be furnace that heats the substrate through the walls of the chamber.

A water vapor line 118 that assumes the form of a tube or pipe connects to and supplies the showerhead 120 with water vapor at ambient temperature. The water vapor is introduced to the showerhead 120 so as to have a dew point (DP) between about 40 and about 80° C. or a water pressure $P(H_2O)$ between about 1 and about 50 Torr via an inert carrier gas, such as argon or nitrogen, that contains a small amount of oxygen between about 10 ppm and 10%.

In order to achieve this DP, from about 1 to about 100 standard liters/min (slm) of inert gas containing oxygen in an amount ranging between about 10 ppm and 10% is passed through a water bottle (not shown) filled with a volume, e.g. of 5 liters, of water that is maintained at a temperature controlled to the target dew point. The amount of water in the water bottle is maintained through conventional means, such as a water pump linked with water level meter(not shown).

Alternately, an appropriate amount of water is pumped through a water vaporizer 128 maintained at or above 100° C., with the pumping speed selected for the inert gas containing oxygen ranging between about 10 ppm and 10% so as to provide a dew point of about 40° C. to about 80° C. or a $P(H_2O)$ between about 1 and about 50 Torr. During this time, the oxygen containing inert gas is passed through the water vaporizer 128 at a flow rate between about 1 and 100 slm.

A significant factor in this process is the location of the pumping system. A pump 124 functionally connects to the chamber 114 via one or more pump lines 126 that terminate at one or more pump ports (not shown) disposed directly through the bottom of the chamber 114. This location of the pumping system is enabled by use of a reactor type design disclosed in this invention. The pumping system is located in close proximity to the precursor conversion and film growth zone. This enables effective removal of reaction by-products.

Further, the location of the pumping system enables better handling of the high gas load that is used in the conversion process. A second significant factor in the increased effectiveness of this process is the use of a large dimension showerhead. The combination of the use of a large showerhead to inject water vapor and oxygen and the use of pumping system in the proximity of the film growth zone enables a uniform flow pattern of the water vapor and oxygen which results in otherwise unobtainable uniform film growth over large areas.

The prior art used conventional furnaces for the conversion process which restricted the location of the exhaust port far away from the precursor conversion and film growth zone. This results in ineffective removal of reaction by-products. Further, the prior art design does not lend itself well to handle large gas loads as well as in attaining uniform distribution of water vapor and oxygen over large areas.

Optionally, a booster pump (not shown) may be used in combination with the pump 124. The pump 124 exhausts reaction byproducts, such as hydrofluoric acid, that may retard the growth rate of REBCO away from the film growth zone through the bottom of the chamber 114. In one embodiment, the pump 124 comprises a conventional vacuum pumping device such as an Edwards model EH500.

Additionally, those skilled in the art will appreciate that the system 100 further includes various sensing and control devices, such as pressure gauges and thermocouples, which are for simplicity not shown in FIG. 1.

In operation, the tapes 112 wind off the payout spools 110, translate through a set of narrow slits (not shown) disposed through the walls of the chamber 114, advance between the showerhead 120 and the substrate heater 122, translate through another set of narrow slits disposed through an opposite wall of the chamber 114, and wind onto the take-up spools 116. As the tapes 112 translate through the precursor decomposition and film growth zone defined by the dimensions of the showerhead 120 and the substrate heater 122, the substrate heater 122 elevates the temperature of the tapes 112 to a temperature in the range of between about 700° C. to about 850° C. while the film consisting of the precursor of rare-earth, barium, and copper contained thereon is exposed to a uniform issuance of inert carrier gas containing oxygen and water vapor from the showerhead 120 as delivered through the water vapor line 118 and the water vaporizer 128. The heat imparted by the substrate heater 122 and the water vapor issued from the showerhead 120, in conjunction with the low-pressure oxygen atmosphere of the chamber 114, cause the film consisting of the precursors of rare-earth, barium, and copper to decompose and react with the oxygen to form a REBCO film. The uniform distribution of carrier gas containing oxygen and water vapor having a consistent vapor pressure [$P(H_2O)$ and $P(O_2)$] throughout the entire precursor decomposition and film growth zone that is provided by the showerhead 120, along with the consistent heat that is delivered to the tapes 112 by the substrate heater 122, is critical to the growth of a highly uniform REBCO film.

The large dimensions of the precursor decomposition and film growth zones provided by the showerhead 120 and the substrate heater 122 enable REBCO film growth to occur over a large area. While the growth of REBCO occurs at the rather slow rate of 1 Angstrom per second under atmospheric pressure, the length of the film growth zone enables the tapes 112 to translate at a speed that, when compounded with the multiplicity of tapes 112 undergoing REBCO film growth, is suitable for the high-throughput ex-situ manufacture of HTS-coated tapes. Alternately, a singlewide tape can be processed uniformly and slit into narrower tapes. Depending upon the conversion rate of an one micron thick film consisting of the precursors of rare-earth, barium, and copper into REBCO, and the length of the substrate heater, the tapes 112 are likely to translate through the system 100 at a velocity between about 1 to about 10 meters per hour under atmospheric pressure. Under a reduced pressure, the tapes 112 are likely to translate through the system 100 at a velocity between about 10 to about 400 meters per hour. Further, the conversion process of precursors to rare-earth, barium, and copper film to REBCO may be repeated multiple times by redepositing a rare-earth, barium fluoride, and copper film atop the tapes 112 once they have translated through the system 100 and subsequently retranslating the tapes through the system 100.

The invention claimed is:

1. A process for producing long lengths of a layered superconductor comprising:
    coating a buffered metal substrate tape with metalorganic precursors of $REBa_2Cu_3O_7$ where RE is a rare earth to form a coated tape, wherein coating is carried out during the process of metalorganic deposition (MOD);
    translating the coated tape through a precursor conversion zone in a process chamber at a rate of at least about 10 meters per hour;
    introducing oxygen and water vapor through a showerhead into the precursor conversion zone while translating the coated tape;
    heating the coated tape to a temperature in the range between about 700° C. to about 850° C. within the precursor conversion zone; and
    reacting the water vapor, oxygen, and the metalorganic precursors of $REBa_2Cu_3O_7$ to form a superconducting coating while translating the coated tape through the precursor conversion zone,
    where the pressure in the process chamber is in the range between about 1 Torr to about 760 Torr and where the substrate resides in the precursor conversion zone for a period of time sufficient to convert the precursors to a superconducting coating epitaxial to the buffer layer.

2. The process of claim 1 where the substrate is selected from the group consisting of stainless steel and nickel alloys.

3. The process of claim 1 where the substrate is biaxially textured.

4. The process of claim 1 where the buffer on the metal substrate tape is selected from the group consisting of YSZ, $CeO_2$, MgO, $SrTiO_3$, $LaMnO_3$, $SrRuO_3$, $Y_2O_3$, $Gd_2O_3$, $LaSrMnO_3$ and combinations thereof.

5. The process of claim 1 where the pressure in the process chamber is in the range between about 10 Torr to about 760 Torr.

6. The process of claim 1 where the atmosphere in the process chamber has a dew point between about 40° C. to about 80° C.

7. The process of claim 1 where a partial pressure of water vapor in the process chamber is between about 1 Torr and about 50 Torr.

8. The process claim 1 where the oxygen is introduced through the showerhead with a carrier gas, an oxygen content in the carrier gas ranging between about 10 ppm and 10%.

9. The process of claim 1 where a partial pressure of the oxygen and water vapor is substantially consistent throughout the precursor conversion zone.

10. The process of claim 1 where the distribution of the oxygen and water vapor is uniform throughout the precursor conversion and film growth zone.

11. A process for producing long lengths of a layered superconductor comprising:
   coating a buffered metal substrate tape with metalorganic precursors of $REBa_2Cu_3O_7$ where RE is a rare earth to form a coated tape, wherein coating is carried out during the process of metalorganic deposition (MOD);
   translating the coated tape through a precursor conversion zone in a process chamber at a rate of at least about 10 meters per hour;
   introducing oxygen and water vapor through a showerhead into the precursor conversion zone while translating the coated tape, the showerhead having a width at least as wide as the sum of the widths of the translating coated tapes plus the sum of the distances between each of the translating coated tapes and having a length at least as great as the width;
   heating the coated tape to a temperature in the range between about 700° C. to about 850° C. within the precursor conversion zone; and
   reacting the water vapor, oxygen, and the metalorganic precursors of $REBa_2Cu_3O_7$ to form a superconducting coating while translating the tape through the precursor conversion zone,
   where the pressure in the process chamber is in the range between about 1 Torr to about 760 Torr and where the substrate resides in the precursor conversion zone for a period of time sufficient to convert the precursors to a superconducting coating epitaxial to the buffer layer.

12. The process of claim 1 wherein reaction by-products are removed from the process chamber by a pumping system located proximate to the precursor conversion zone.

13. The process of claim 1 wherein the process chamber is a cold-wall chamber.

14. The process of claim 1, wherein the showerhead has a plurality of fine openings through which the oxygen and water vapor pass.

15. The process of claim 14, wherein the fine openings are evenly spaced.

16. The process of claim 1, wherein translating occurs at a rate between 10 and 400 meters per hour.

17. The process of claim 11, wherein translating occurs at a rate between 10 and 400 meters per hour.

18. The process of claim 1, wherein MOD includes applying a solution of organic complexes of rare-earth, barium, and copper to the buffered substrate tape and heating the coated tape to remove the organic compounds.

* * * * *